United States Patent [19]
Llewellyn

[11] Patent Number: 5,463,655
[45] Date of Patent: Oct. 31, 1995

[54] SINGLE-ENDED PULSE GATING CIRCUIT

[75] Inventor: William D. Llewellyn, San Jose, Calif.

[73] Assignee: National Semiconductor Corporation, Santa Clara, Calif.

[21] Appl. No.: 18,622

[22] Filed: Feb. 17, 1993

[51] Int. Cl.⁶ .................................................. H04L 7/02
[52] U.S. Cl. .................. 375/359; 375/373; 327/156; 327/299
[58] Field of Search ................................. 375/110, 118, 375/119, 120, 106, 121; 328/72, 63; 307/480

[56] References Cited

U.S. PATENT DOCUMENTS

| | | | |
|---|---|---|---|
| 4,230,991 | 10/1980 | Paphitis | 328/140 |
| 4,481,640 | 11/1984 | Chow et al. | 375/1 |
| 4,864,303 | 9/1989 | Ofek | 341/95 |
| 4,935,942 | 6/1990 | Hwang et al. | 375/106 |
| 4,984,255 | 1/1991 | Davis et al. | 375/106 |
| 5,081,297 | 1/1992 | Lebel et al. | 395/325 |
| 5,124,597 | 6/1992 | Stuebing et al. | 307/601 |
| 5,172,397 | 12/1992 | Llewellyn | 375/110 |
| 5,220,212 | 6/1993 | Sinh | 307/455 |
| 5,321,702 | 6/1994 | Brown et al. | 371/27 |

FOREIGN PATENT DOCUMENTS

| | | |
|---|---|---|
| 56-132043 | 10/1981 | Japan . |
| 2242085 | 9/1991 | United Kingdom . |

*Primary Examiner*—Edward L. Coles, Sr.
*Assistant Examiner*—Madeleine Nguyen
*Attorney, Agent, or Firm*—Skjerven, Morrill, MacPherson, Franklin & Friel; David E. Steuber

[57] ABSTRACT

The present invention provides a gating circuit having two separate paths for detecting even and odd bits. Each path includes an equal number of coupled flip-flops. After bit detection, combinational logic merges the two paths to provide an output signal. An optional reset signal initializes all flip-flops to a logic zero at the start of a data read operation.

78 Claims, 13 Drawing Sheets

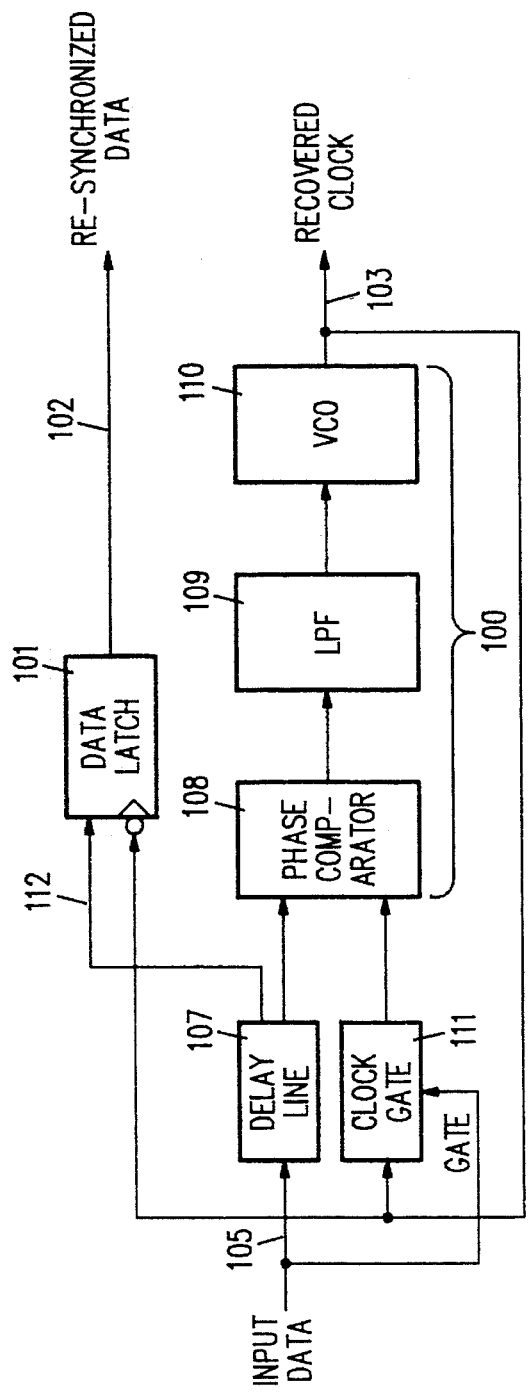
PRIOR ART
FIG. 1A
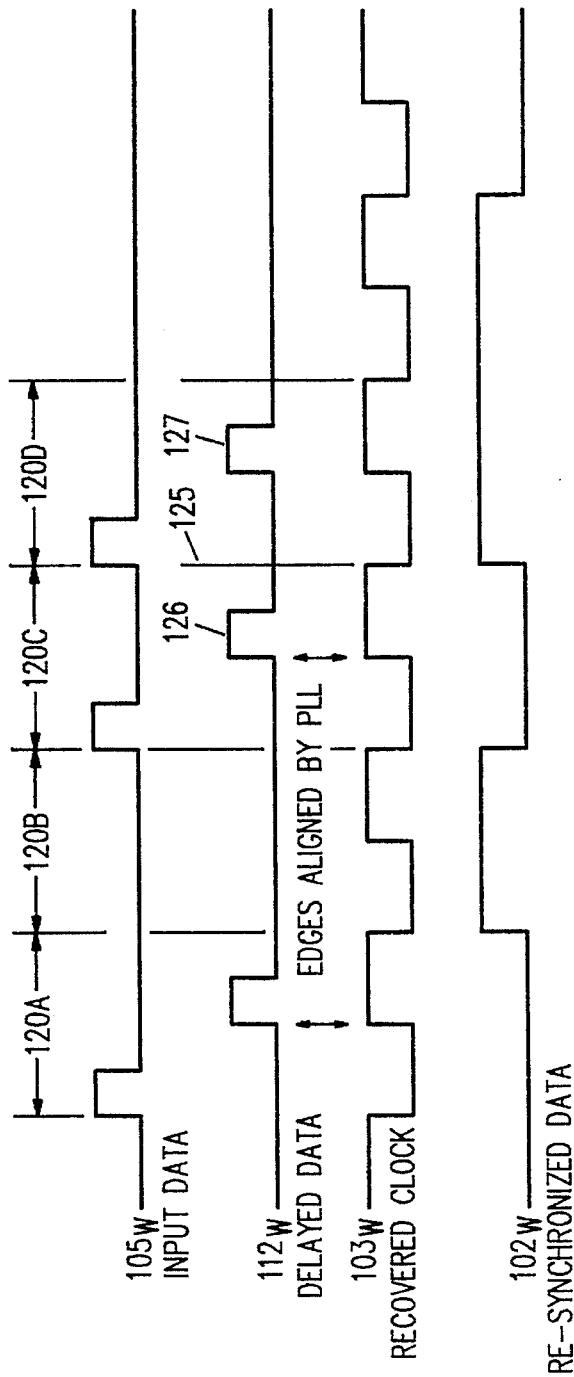
PRIOR ART
FIG. 1B

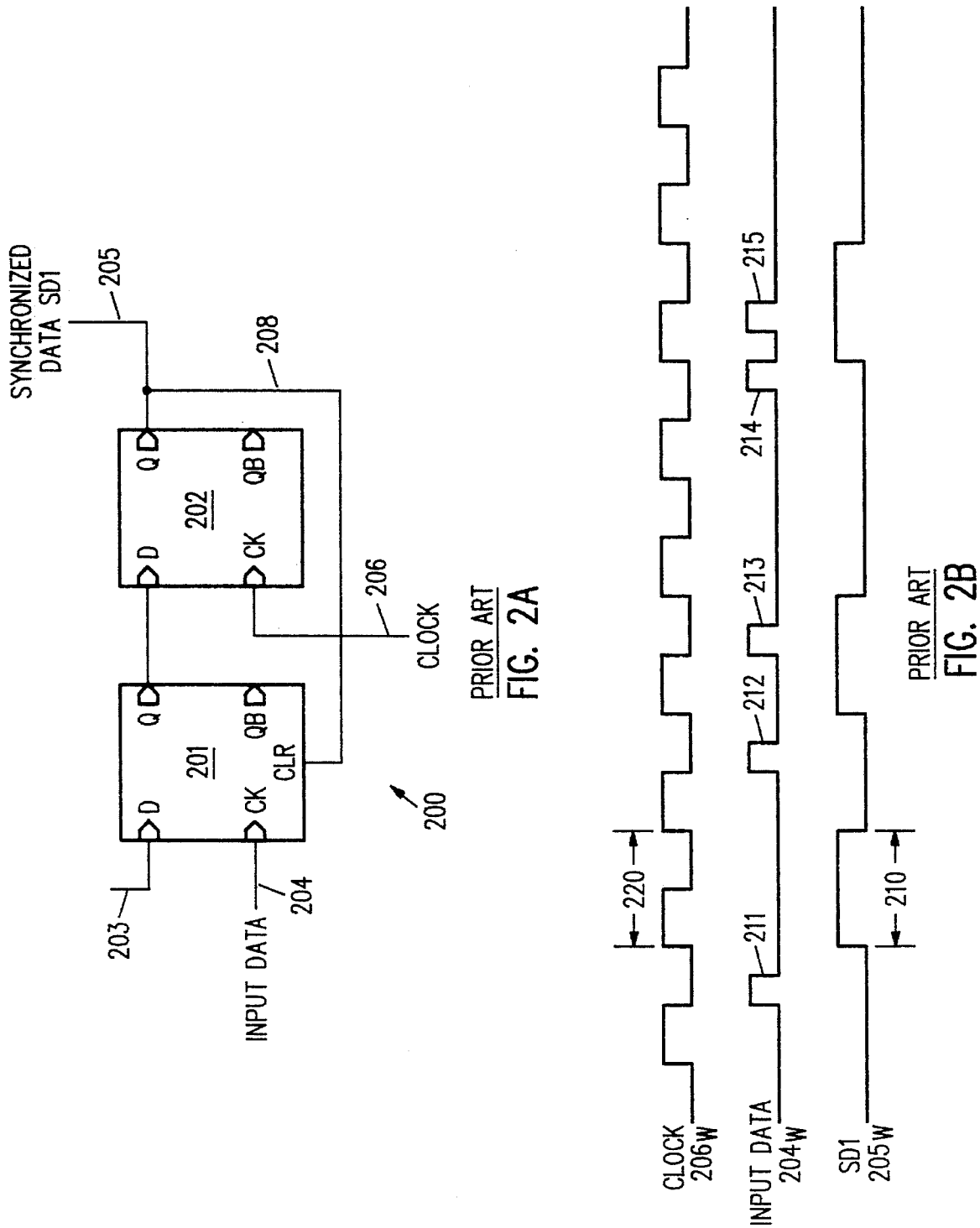
PRIOR ART
FIG. 2A
PRIOR ART
FIG. 2B

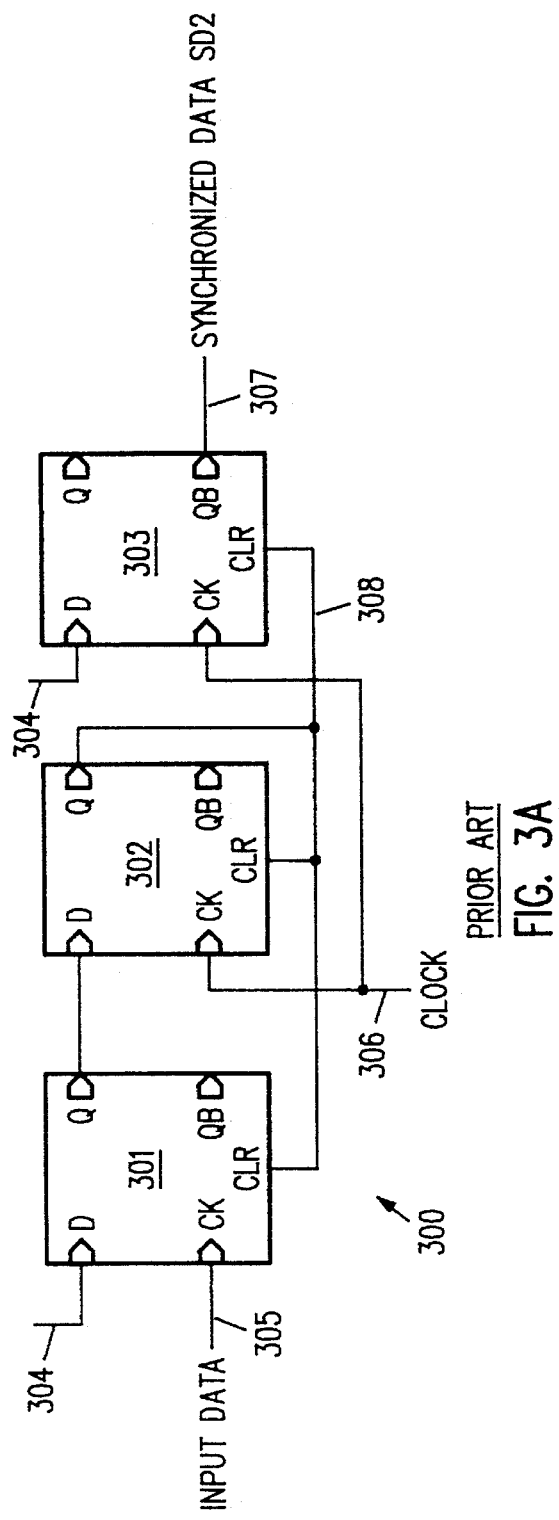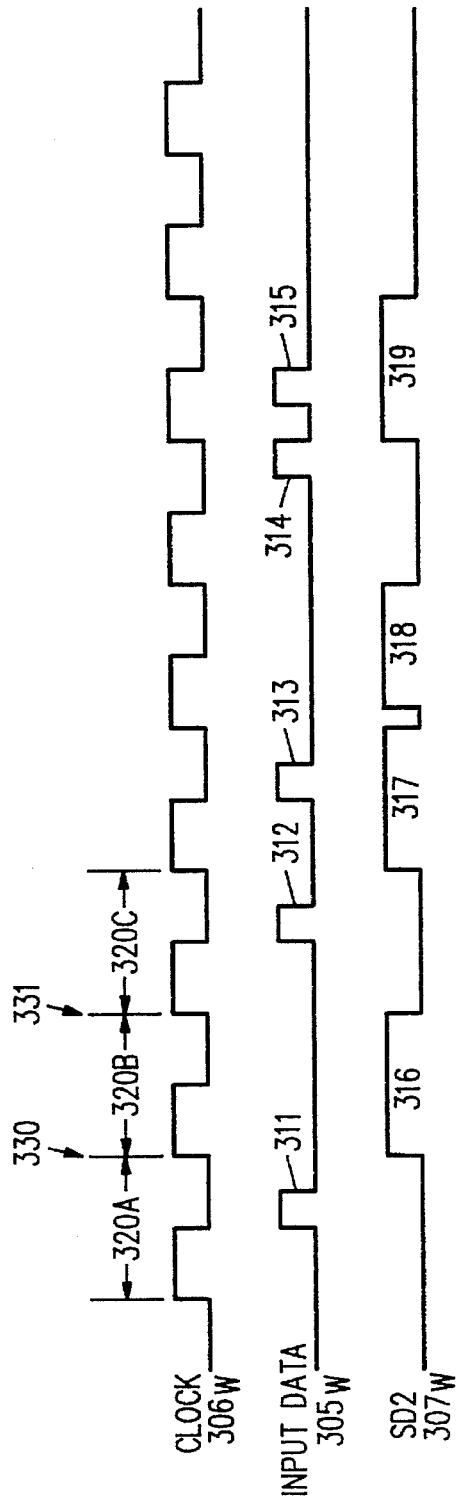
PRIOR ART
FIG. 3A
PRIOR ART
FIG. 3B

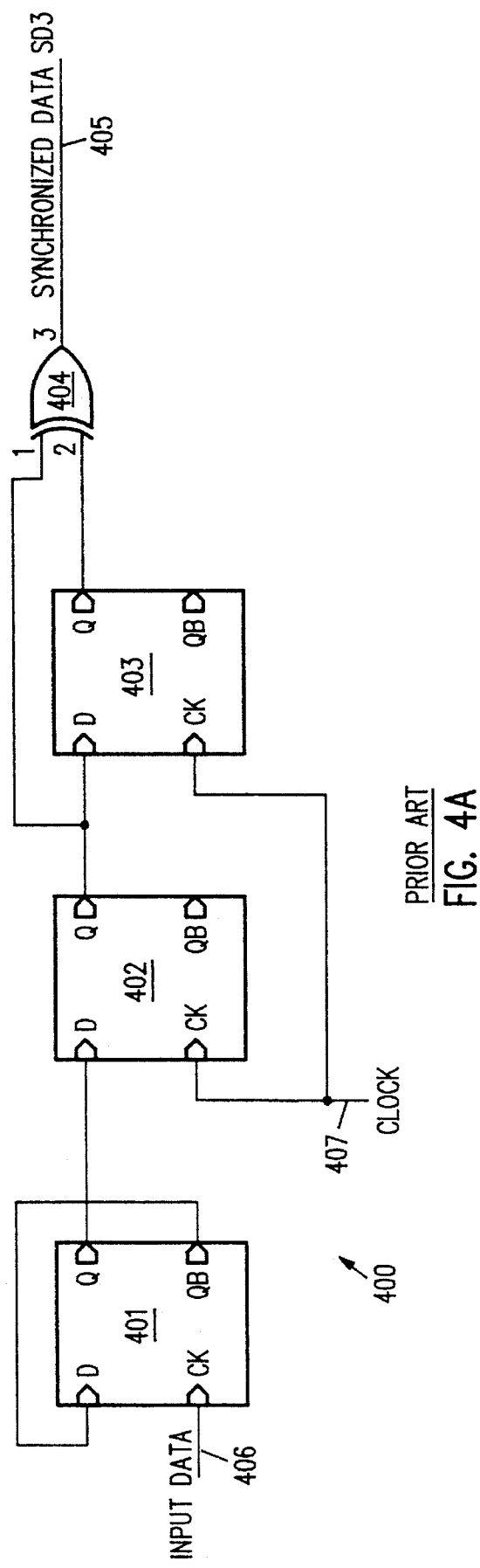
PRIOR ART
FIG. 4A
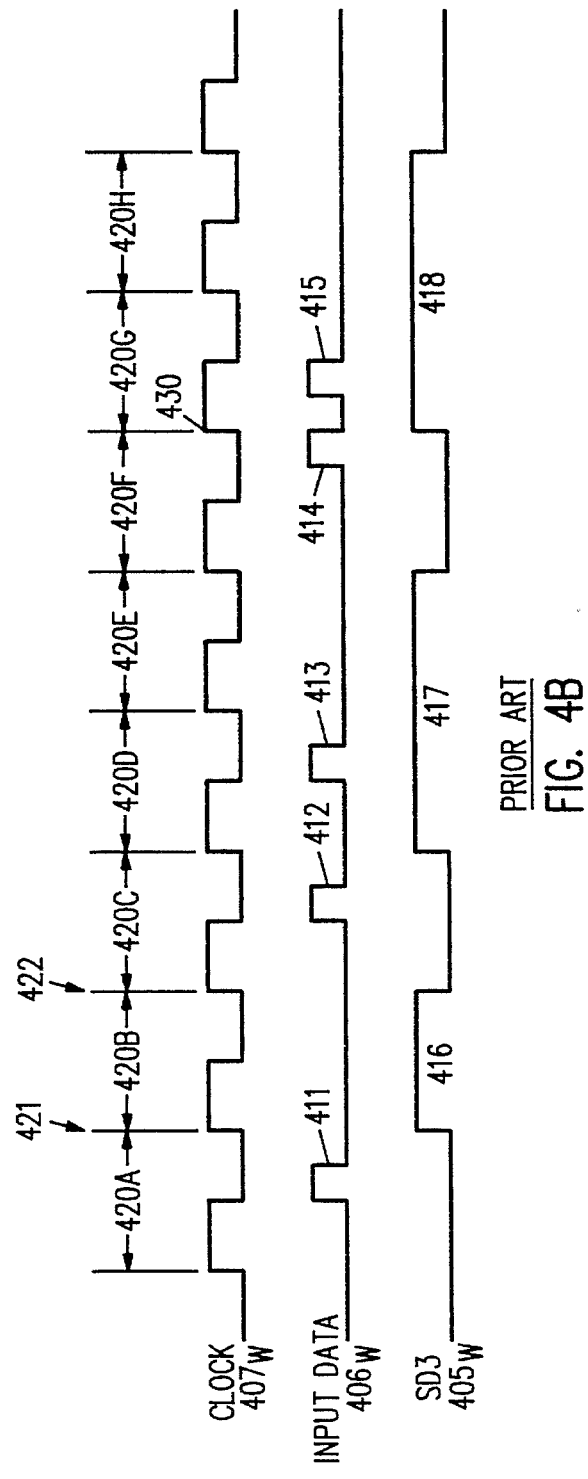
PRIOR ART
FIG. 4B

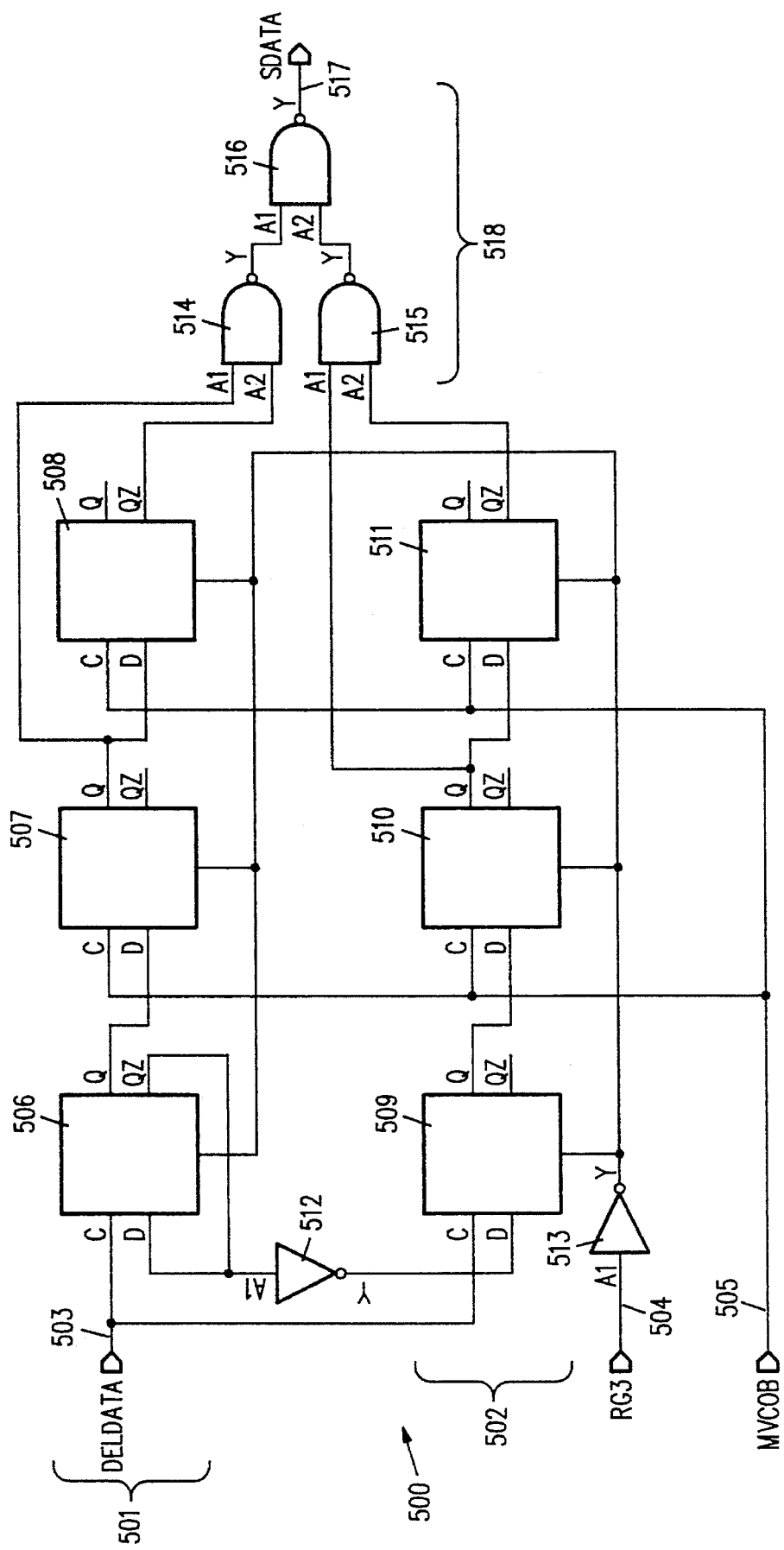
FIG. 5A

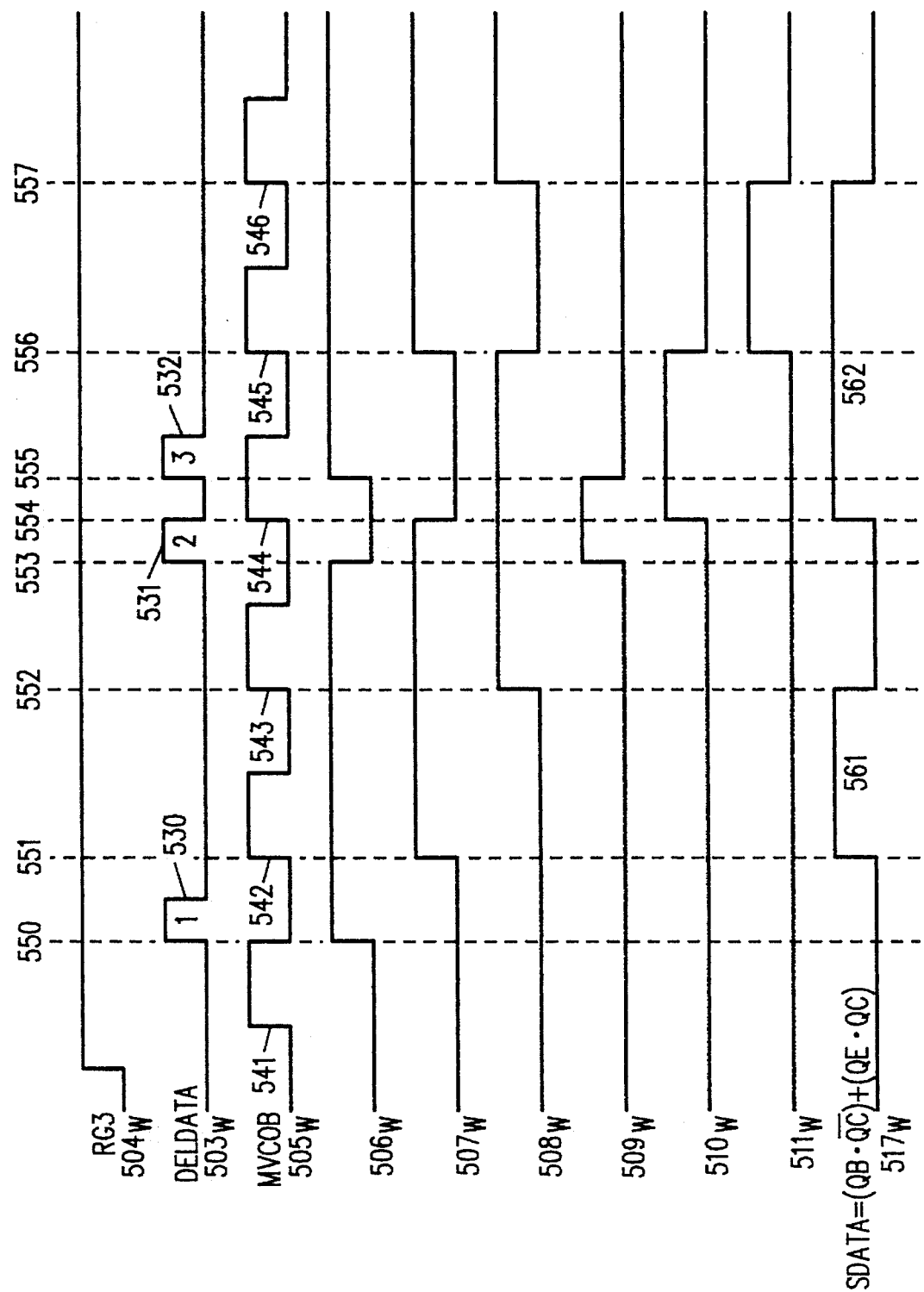
FIG. 5B

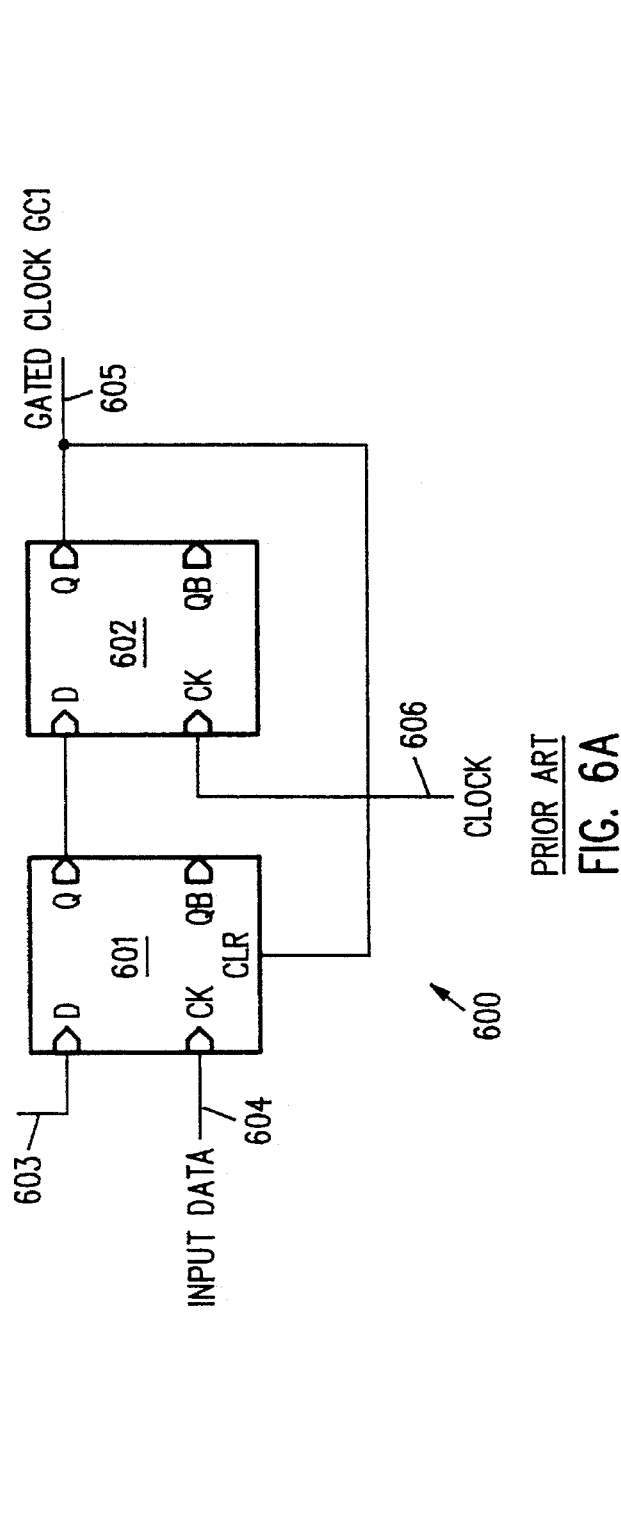
PRIOR ART
FIG. 6A
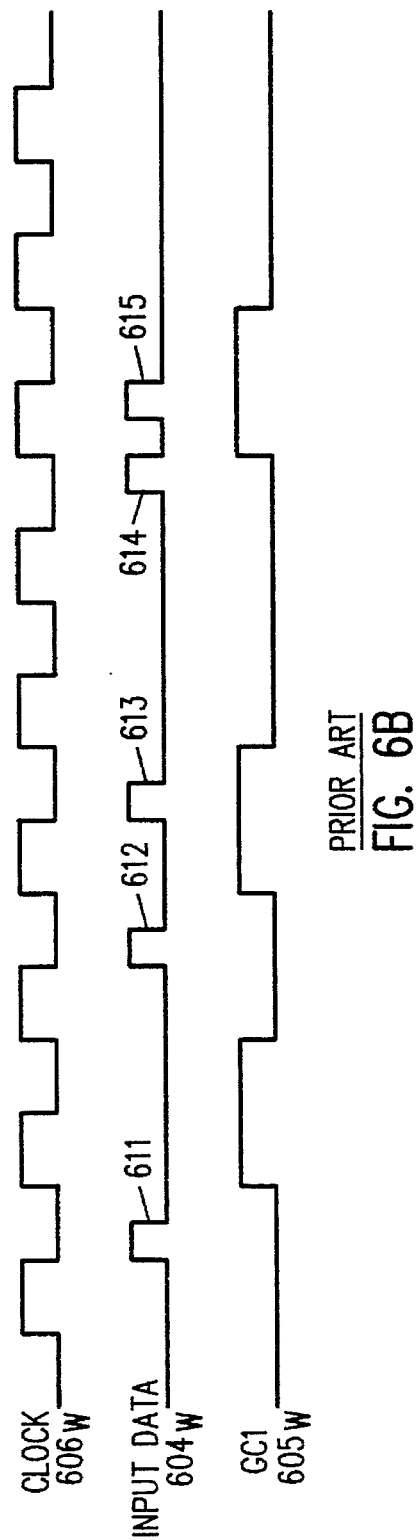
PRIOR ART
FIG. 6B

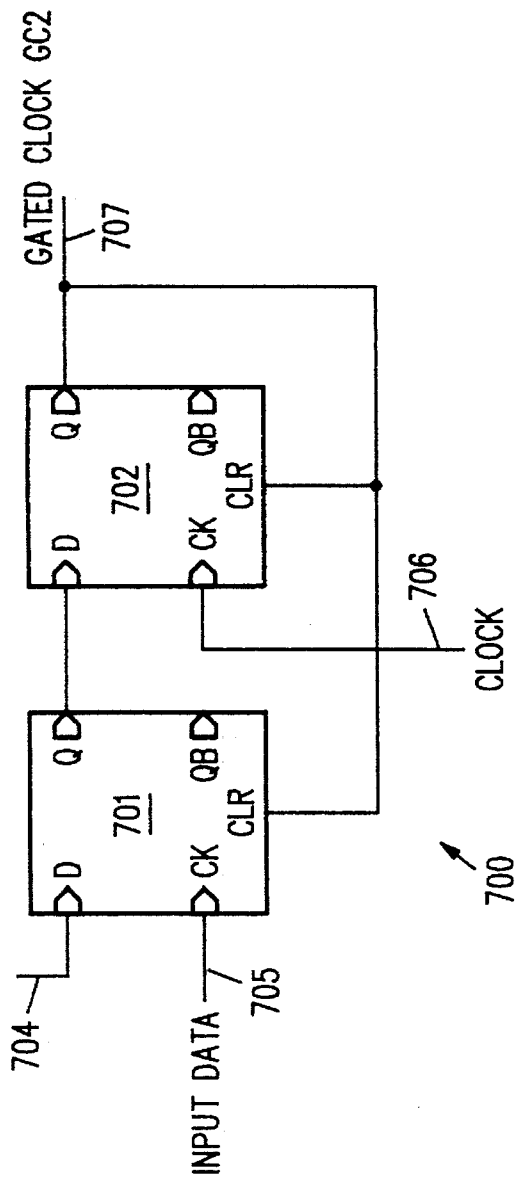
FIG. 7A
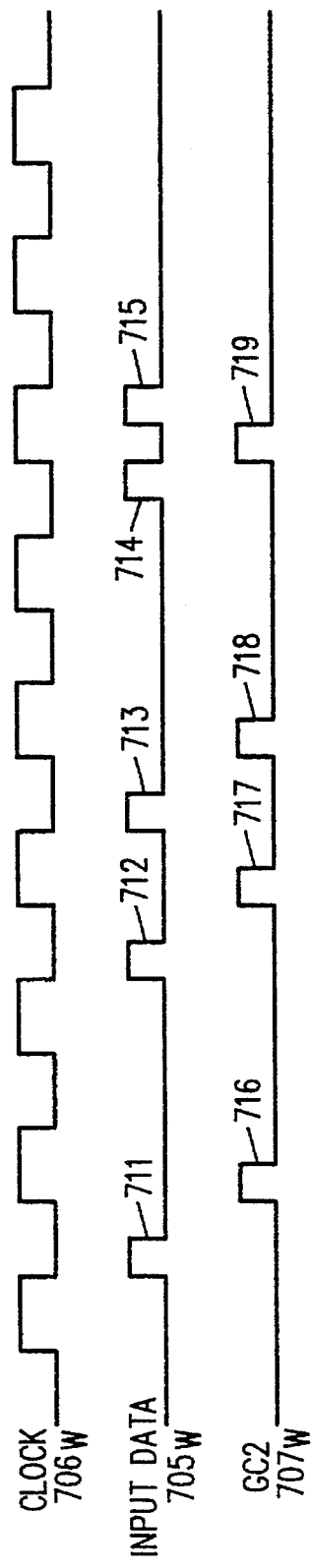
FIG. 7B

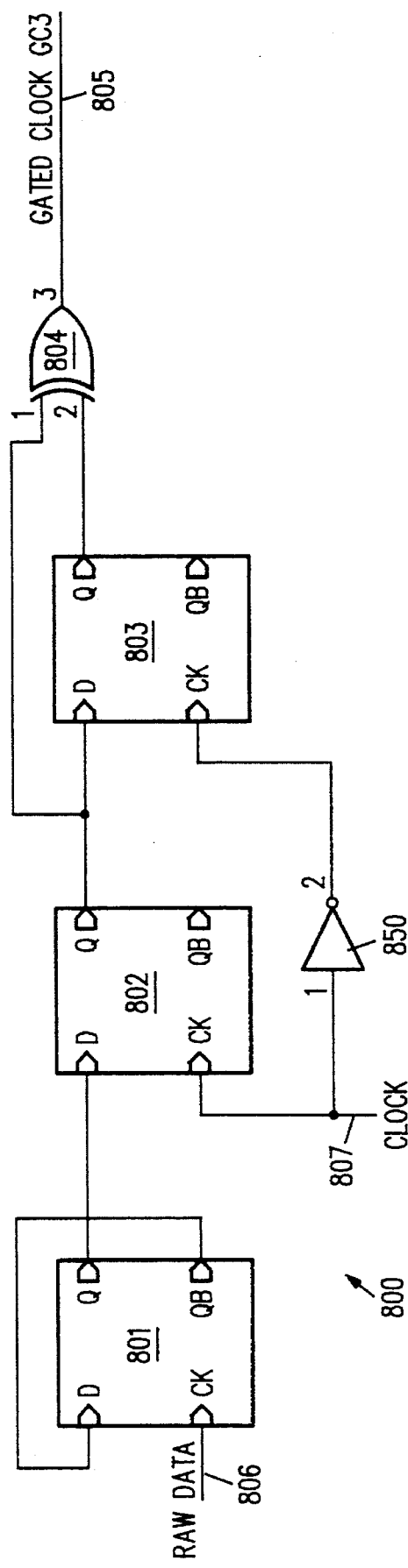
FIG. 8A
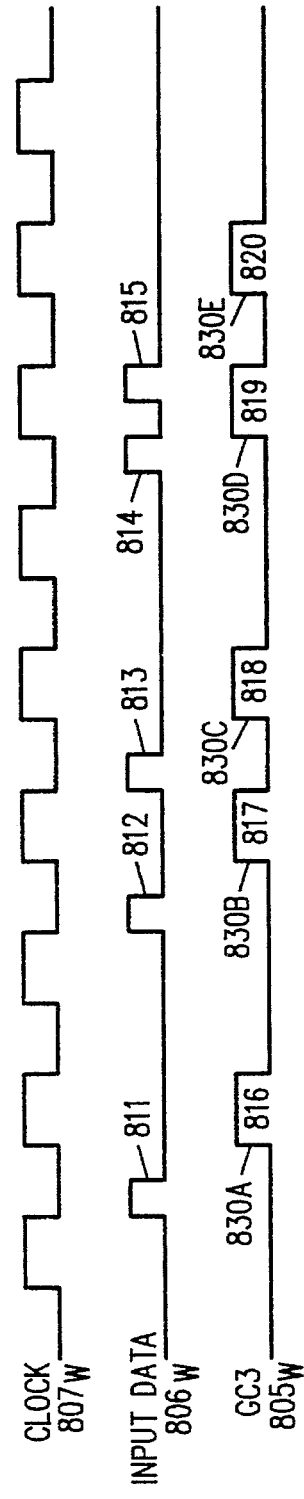
FIG. 8B

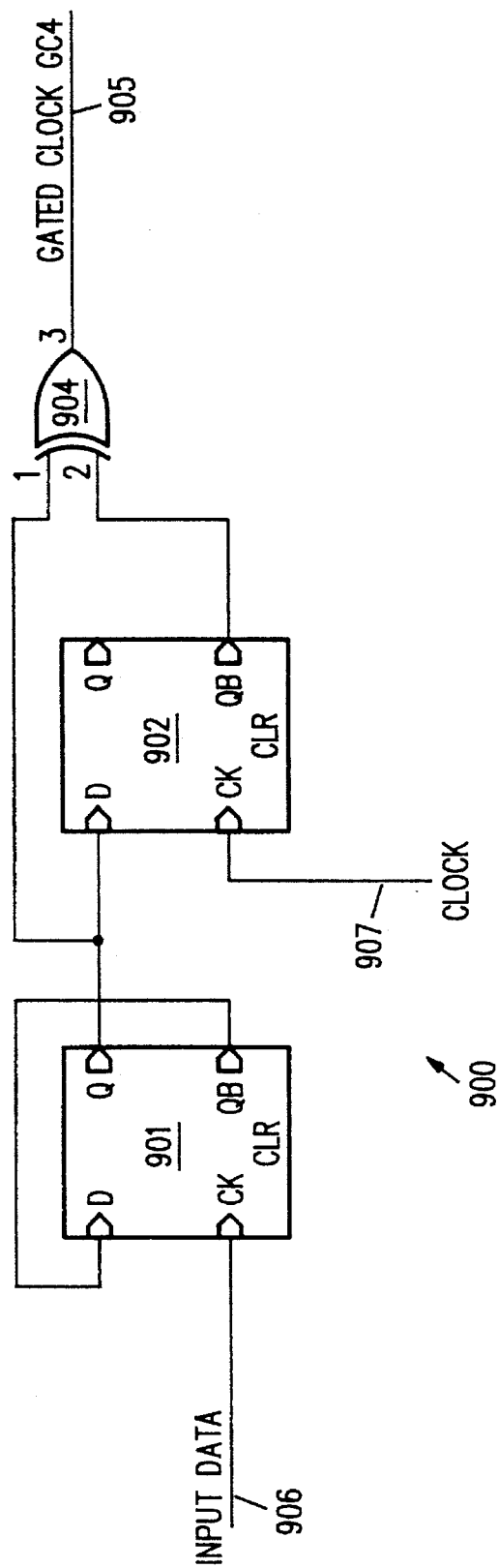
FIG. 9A
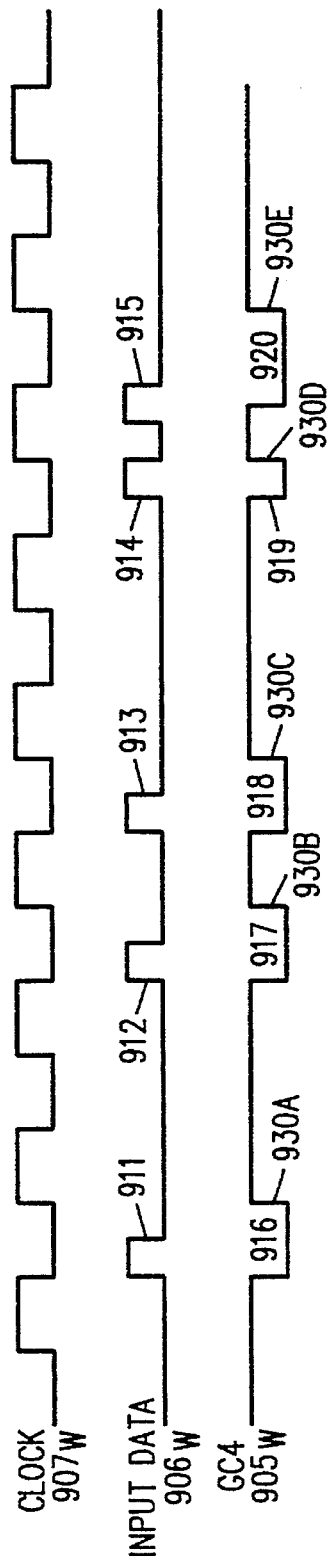
FIG. 9B

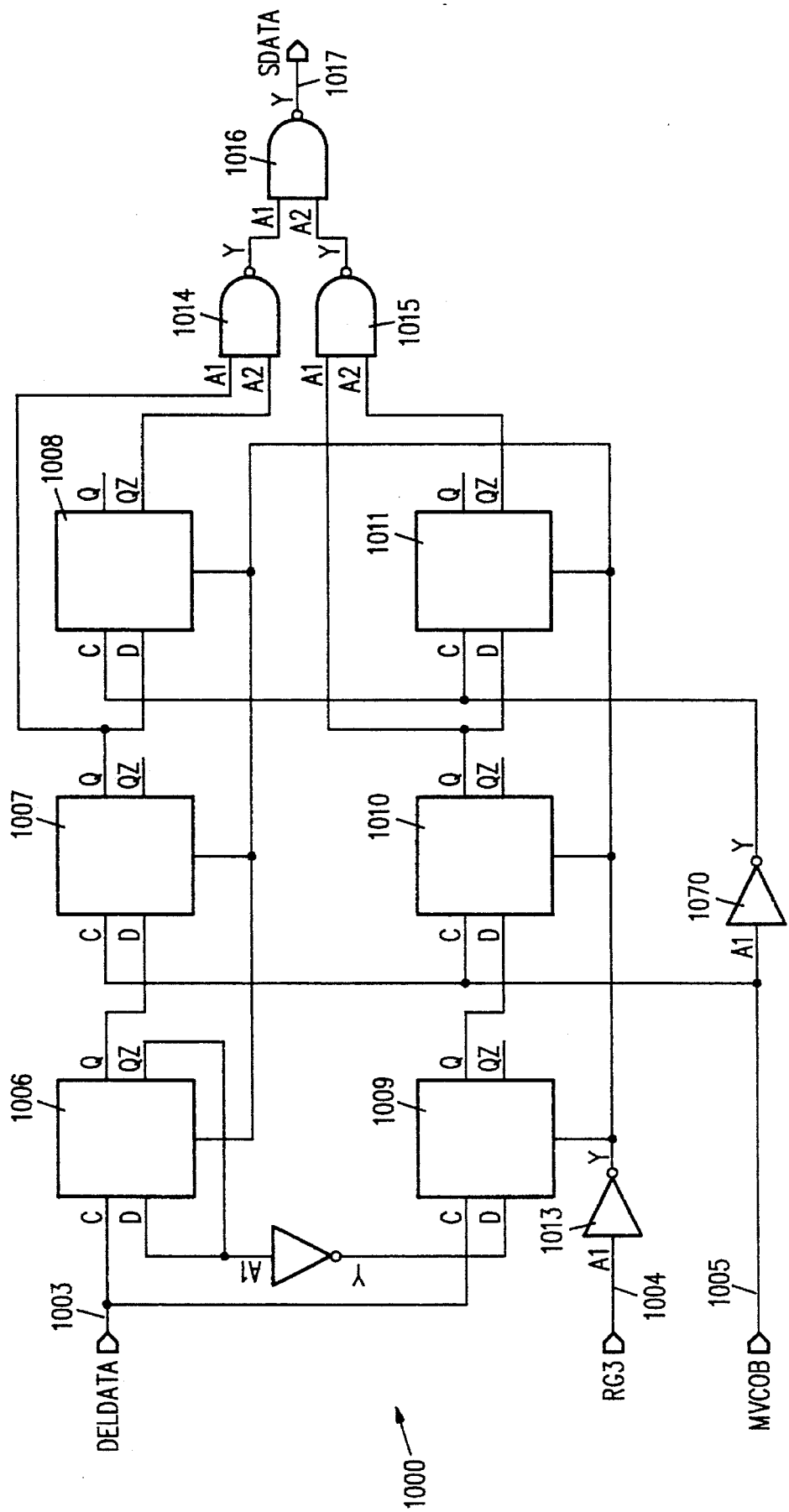
FIG. 10A

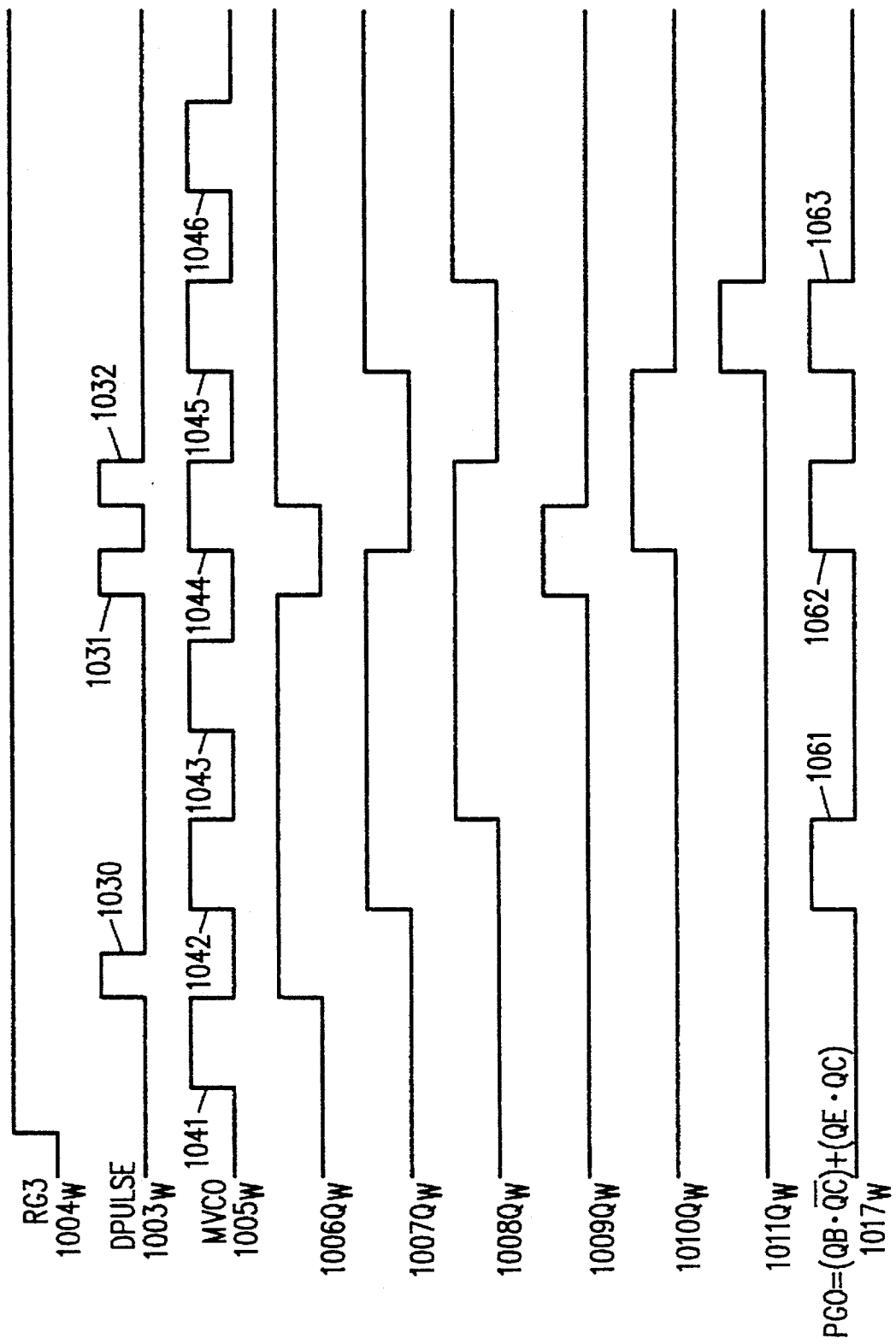

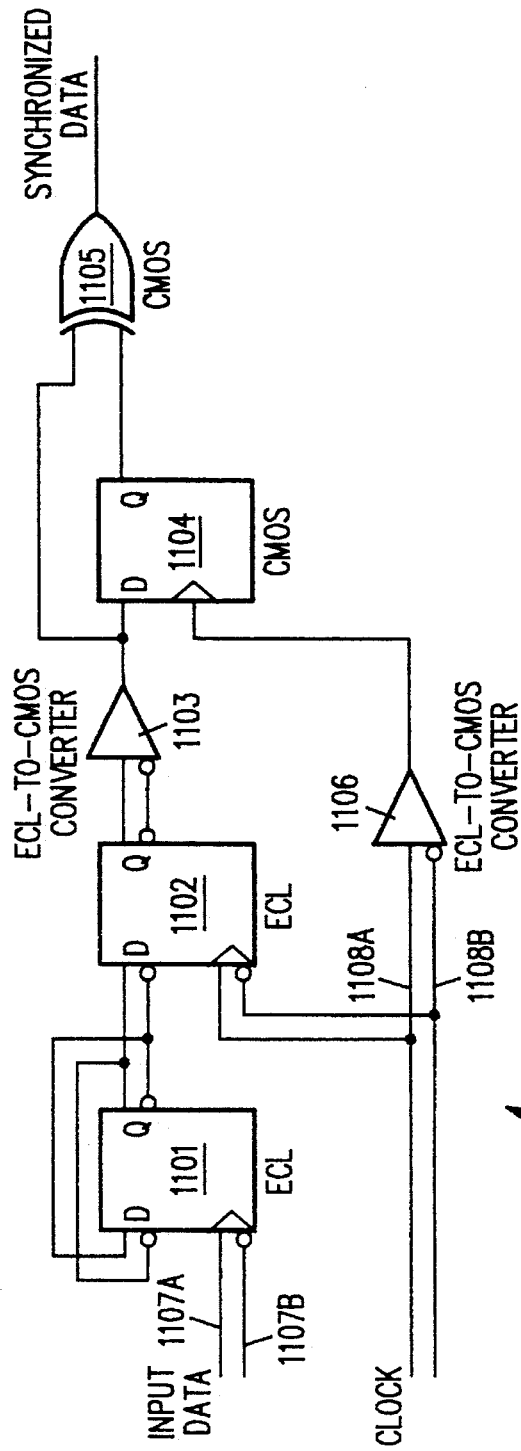
FIG. 11A
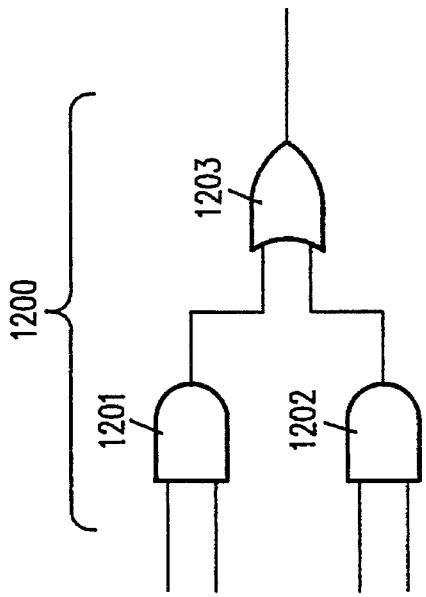
FIG. 12
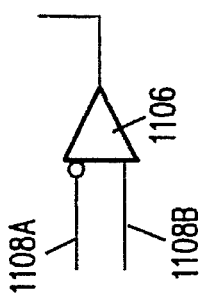
FIG. 11B

SINGLE-ENDED PULSE GATING CIRCUIT

BACKGROUND OF THE INVENTION

1. Field of the Invention

The present invention relates to a gating circuit and in particular to a clocked digital pulse gating mechanism for use within serial data re-synchronization circuitry.

2. Description of the Related Art

Referring to FIG. 1A, it is well known in the art to recover a periodic clock waveform from a pseudo-random, asynchronous data source with a phase-locked loop (PLL) 100 in serial data clock recovery and data re-synchronization applications. PLL 100 typically includes a phase comparator 108, a low pass filter (LPF) 109, and a voltage controlled oscillator (VCO) 110. Phase comparator 108 compares two input frequencies provided initially on lines 105 and 103 and passed through delay line 107 and clock gate 111, respectively. Phase comparator 108 then generates an output phase-error signal that is determined by the phase difference between these two frequencies. If the frequency on line 105 does not equal the frequency on line 103, the phase-error signal, after being filtered by LPF 109, causes the frequency of VCO 110 to deviate in the direction of the frequency on line 105. If PLL 100 is properly designed, VCO 110 locks to the frequency on line 105 and ignores the missing pulses (zeroes) of the pseudo-random data. The recovered clock waveform $103_w$ (FIG. 1B) generated by PLL 100 frames each delayed pulse with its falling edges. This provides a "window" 120 for every bit (see waveforms $105_w$ and $112_w$ which represent signals provided on lines 105 and 112, respectively). Note that an input data pulse typically represents a logic one while the absence of a pulse typically represents a logic zero. LPF 109 largely ignores the jitter of individual bits within these clocked windows, thereby maintaining the center of window 120 about the average bit position and ensuring proper detection of most bits.

The bit capture circuit (hereinafter referred to as data latch 101), is provided raw, unsynchronized data on line 112 (via delay line 107 from line 105) and a recovered clock signal on line 103. Data latch 101 captures the data bits on line 112 and then transmits these bits as re-synchronized data on line 102 (see waveform $102_w$).

Data latch 101 has the following requirements:
1. a very small metastability region at the window boundaries for minimum decision loss,
2. a rapid recovery from transmission of each bit for maximum transfer rate capability (high pulse repetition rate), and
3. an NRZ (non-return-to-zero) output pulse.

Ideally, even if two bits in adjacent windows, for example bits 126 and 127 in windows 120C and 120D, respectively, are pushed toward each other, almost to the point where the two bits meet at the common boundary 125, bits 126 and 127 should still be properly recognized by data latch 101. In other words, the data latch recovery (reset) time from transmittal of any single bit until it is ready for the next data bit should approach zero, therefore allowing for maximum data throughput and jitter tolerance.

FIG. 2A illustrate a data latch 200 known in the art which includes flip-flops 201 and 202. Assuming a logic one signal is provided to input data terminal D via line 203, the signal on the Q-output terminal of flip-flop 201 is set to a logic one if a data bit is provided on line 204. By definition, this logic one is also subsequently provided on the data input terminal D of flip-flop 202. The next clock edge on line 206 (waveform $206_w$ of FIG. 2B) transfers this logic one signal to the Q-output terminal of flip-flop 202 and clears flip-flop 201 via line 208. However, although data latch 200 provides the appropriate output pulse width 210 for waveform $205_w$, data latch 200 fails to identify data pulses, for example the second bit in each pair 212/213 and 214/215, which occur at or faster than the clock frequency (waveform $206_w$). Therefore, bits must be spaced apart by at least one empty window 220 to allow the signal on the Q-output terminal of flip-flop 202 to fall low and release the clear on flip-flop 201. Thus, bits 211, 212, and 214 are detected by data latch 200 while bits 213 and 215 remain undetected. Although this is acceptable for some types of channel encoding schemes, data latch 200 excludes those schemes which incorporate data at the clock frequency. Moreover, even if the bits are spaced apart by at least one empty window 220, such as bits 211 and 212 on waveform $204_w$, data latch 200 may yield errors because of jittery data in which random noise pushes bits into positions closer together than data latch 200 can tolerate.

Referring to FIGS. 3A and 3B, another known data latch 300 includes three flip flops 301, 302 and 303 in a backlash clear scheme as explained in detail below. Flip-flop 301 is used as a bit trap, i.e. the signal of the Q-output terminal of flip-flop 301 is set to a logic one when a data bit, for example bit 311, is provided on line 305. The next clock edge provided on line 306 to the clock input terminals CK of flip-flops 302 and 303 at time 330 (FIG. 3B) sets the signal of the Q-output terminal of flip-flop 302 to a logic one which in turn clears all flip-flops via line 308. Clearing flip-flop 303 triggers the synchronized data output pulse SD2 (waveform $307_w$) at the $\overline{Q}$-output of flip-flop 303. Because the "clear" pulse is typically very short, flip-flop 301 is ready to receive data a full clock period sooner than data latch 201 of FIG. 2. At time 331 (FIG. 3B), the rising clock edge sets the signal of the Q-output terminal of flip-flop 303 to a logic zero, thereby ending the synchronized data pulse 316.

Flip-flop 301 cannot accept new data until approximately two gate delays (i.e. the propagation delay of a signal from the data input terminal D to the Q-output terminal of flip-flop 302 and the clear-release time of flip-flop 301) following the rising clock edge at time 330 (waveform $306_w$). Thus, from the time bit 311 in window 320A first clocks flip-flop 301 until the time flip-flop 301 is cleared and released, a "blind spot" encroaches into window 320B. As transfer frequency is increased and window size shrinks, this blind spot can encroach over an appreciable percentage of the next window. Thus, as shown in FIG. 3B, although bits 311, 312, 313 and 314 are detected (see pulses 316, 317, 318 and 319, respectively, on synchronized data waveform $307_w$), bit 315 remains undetected. Thus, window truncation inhibits high frequency data transmission and increases the error rate in jittery data.

FIG. 4 illustrates another prior art data latch 400 which includes flip-flops 401, 402, 403 and an XOR gate 404. In data latch 400, flip-flop 401 is not tripped and cleared with each input data bit, but instead is only toggled with the rising edges of the input data bits. In the absence of any input data, the signals on all the Q-output terminals of flip-flops 401, 402 and 403 are in the same logic state. For simplicity, assume all flip-flops have logic zero signals on their Q-output terminals. An incoming data bit 411 on line 406 (see waveform $406_w$ in FIG. 4B) toggles the signal of the Q-output terminal of flip-flop 401 to a logic one. The rising clock edge (waveform $407_w$) at time 421 sets the signal on the Q-output terminal of flip-flop 402 to a logic one. Thus, flip-flop 402 and flip-flop 403 now have signals of opposite logic states on their Q-output terminals. These signals are in turn provided to the two input terminals of XOR gate 404. With these input signals, XOR gate 404 transmits a logic one signal on output line 405, thereby initiating the synchronized data output pulse 416 (waveform $405_w$ in FIG. 4B). The next clock edge at time 422 clocks the signal on the Q-output terminal of flip-flop 403 to a logic one. Because both input signals to XOR gate 404 are logic ones, XOR gate 404 provides a logic zero output signal on line 405, thereby terminating synchronized data pulse 416. Note that pulse 416 is exactly the width of one clock window 420 because both the rising and falling edges of pulses 416 experience the same number of gate delays relative to the incoming clock signal (see waveform $407_w$).

Bits arriving at the clock frequency, for example bits 412 and 413 of waveform $406_w$, produce a continuous logic one signal (pulse 417) on output line 405 (waveform $405_w$). This logic one output signal is a desired response to adjacent pulses in the input data pattern. Note that in this configuration, bits (such as bits 414 and 415) may be spaced significantly closer than the clock period, i.e. window 420. Because there is no encroachment of window 420F, for example, into window 420G, even if bit 414 arrives just before a clock edge 430 and bit 415 arrives just after the clock edge 430, both bits are detected and result in a contiguous pulse 418 on waveform $405_w$. Additional information regarding the operation of data latch 400 is disclosed in U.S. Pat. No. 5,172,397, issued Dec. 15, 1992, and is herein incorporated by reference in its entirety.

Because flip-flops 401, 402 and 403 are not cleared, the blind spot created by the data latch 300, for example, is eliminated. Moreover, flip-flops 401, 402 and 403 operate at half the frequency of their counterparts in FIGS. 2A and 3A.

However, data latch 400 is preferably implemented in differential emitter-coupled logic (ECL) because propagation delays in this form of logic are independent of the direction of edge transition (e.g., the propagation delay from a flip-flop clock input to a positive transition at its Q output is equal to the propagation delay between the clock input and the negative transition at the Q output). This is significant because data window boundaries are alternately defined by the following periods:

1. the propagation delay of a logic one signal on line 406 from the clock input terminal CK on flip-flop 401 to a logic one at its Q-output terminal, plus the set-up time of a logic one at the D-input terminal of flip-flop 402, or 2. the propagation delay of a logic zero signal on line 406 from the clock input terminal CK on flip-flop 401 to a logic zero at its Q-output terminal, plus the set-up time of a logic zero at the D-input terminal of flip-flop 402.

In differential ECL logic, periods 1 and 2 are substantial equal. ECL has the disadvantages of being physically larger and consuming significantly more power than CMOS logic. However, if data latch 400 is implemented in single-ended CMOS technology, achieving substantially equal time delays for periods 1 and 2 is difficult, and frequently results in a skew in size between odd-bit windows and even-bit windows.

SUMMARY OF THE INVENTION

In accordance with the present invention, a gating circuit includes two separate paths for detecting even and odd bits. Specifically, the first path is triggered by even data bits to provide a first predetermined logic state signal, and is triggered by odd data bits to provide a second logic state signal. In contrast, the second path is triggered by even data pulses to provide the second logic state signal, and is triggered by odd data pulses to provide the first logic state signal. The gating circuit further includes combinatorial logic to couple the first and second paths to provide an output signal.

The first path includes a first plurality of coupled flip-flops. In one embodiment of the present invention, the first plurality of flip-flops includes a first, second, and third flip-flop. Each flip-flop has a data input terminal, a clock input terminal, and an output terminal. The first flip-flop includes an additional output terminal.

The output terminal of the first flip-flop is coupled to the data input terminal of the second flip-flop, the additional output terminal of the first flip-flop is coupled to the data input terminal of the first flip-flop, and the output terminal of the second flip-flop is coupled to the data input terminal of the third flip-flop.

Each path includes an equal number of coupled flip-flops. Thus, in this embodiment of the present invention, the second path comprises a second plurality of coupled flip-flops. Specifically, the second plurality of flip-flops includes a fourth, fifth, and sixth flip-flop. Each flip-flop in the second path also has a data input terminal, a clock input terminal, and an output terminal. The output terminal of the fourth flip-flop is coupled to the data input terminal of the fifth flip-flop, and the output terminal of the fifth flip-flop is coupled to the data input terminal of the sixth flip-flop.

The data latch of the present invention further includes a data input line and a clock input signal line. The clock input terminals of the first and fourth flip-flops are coupled to the data input line. The clock input terminals of the second, third, fifth, and sixth flip-flops are coupled to the clock input signal line. The additional output terminal of the first flip-flop is coupled to the input terminal of the fourth flip-flop via an inverter. This presents the equivalent logic state of the output terminal of the first flip-flop to the data input terminal of the fourth flip-flop without affecting the loading, and therefore the propagation delay, of the signal at the output terminal of the first flip-flop. In this manner, the propagation delay between the clock input terminals and the output terminals of the first and fourth flip-flops is equal.

The combinatorial logic in this embodiment of the present invention includes a first, second, and third NAND gate. Each NAND gate has a first input terminal, a second input terminal, and an output terminal. The output terminal of the third flip-flop is coupled to the second input terminal of the first NAND gate. The output terminal of the second flip-flop is coupled to the first input terminal of the first NAND gate.

In further accordance with this embodiment of the present invention, the output terminal of the sixth flip-flop is coupled to the second input terminal of the second NAND gate. The output terminal of said fifth flip-flop is coupled to said first input terminal of said second NAND gate. The output terminal of the first NAND gate is coupled to the first input terminal of the third NAND gate. The output terminal of the second NAND gate is coupled to the second input terminal of the third NAND gate. The output line of the third NAND gate provides the output signal. The above-described gated circuit provides a substantially fully-open pulse capture window. A typical application for this gated circuit is a data latch to provide a synchronous data signal in a serial data receiver.

In further accordance with the present invention, a clock gate is provided having the above-described configuration of the data latch, but additionally having a second inverter which inverts the clock signal to the third and sixth flip-flops. In this manner, the output signal, i.e. the gated clock signal, provided by the output line of the third NAND gate is one-half of the input clock signal period. Thus, the present invention provides a desirable gated clock source for downstream circuitry.

In another embodiment of the present invention, the combinatorial logic includes a first and a second AND gate and a NOR gate. Coupling of these gates is accomplished in a manner similar to that described above for the three NAND gates, wherein the first and second AND gates replace the first and second NAND gates and the NOR gate replaces the third NAND gate.

In further accordance with the present invention, a data latch is provided which includes mean for splitting odd and even data pulses and means for receiving these data pulses and outputting synchronous data. The means for splitting is implemented in differential, ECL circuitry, whereas the means for receiving is implemented in CMOS circuitry. In this manner, the data latch significantly improves performance of the circuit by having all timing decisions performed by differential, ECL circuitry whose balanced rising-and-falling edge propogation delays are well-suited for handling odd and even bits symmetrically. The CMOS flip-flop and XOR gate function to shape the output pulse after input bit re-timing has occurred in ECL logic.

BRIEF DESCRIPTION OF THE DRAWINGS

FIG. 1A illustrates a block diagram of a conventional phase-locked loop in a data synchronization application.

FIG. 1B shows various waveforms provided to and by the circuit illustrated in FIG. 1A.

FIG. 2A illustrates a prior art data latch including two flip-flops.

FIG. 2B show various waveforms provided to and by the data latch illustrated in FIG. 2A.

FIG. 3A illustrates another prior art data latch including three flip-flops coupled in a backlash configuration.

FIG. 3B shows various waveforms provided to and by the data latch illustrated in FIG. 3A.

FIG. 4A illustrates another prior art data latch including three flip-flops and an XOR gate.

FIG. 4B shows various waveforms provided to and by the data latch illustrated in FIG. 4A.

FIG. 5A illustrates a data latch in accordance with the present invention which includes separate paths for even and odd bits.

FIG. 5B shows various waveforms provided to and by the data latch illustrated in FIG. 5A.

FIG. 6A illustrates a prior art clock gate.

FIG. 6B shows various waveforms provided to and by the clock gate of FIG. 6A.

FIG. 7A illustrates another prior art clock gate.

FIG. 7B shows various waveform provided to and by the clock gate of FIG. 7A.

FIG. 8A illustrates another prior art clock gate.

FIG. 8B shows various waveforms provided to and by the clock gate of FIG. 8A.

FIG. 9A illustrates another prior art clock gate.

FIG. 9B shows various waveform provided to and by the clock gate of FIG. 9A.

FIG. 10A illustrates a clock gate in accordance with the present invention.

FIG. 10B shows various waveform provided to and by the clock gate of FIG. 10A.

FIG. 11A illustrates another embodiment of a pulse gating circuit of the present invention which combines bipolar and CMOS technology.

FIG. 11B shows a configuration of ECL-to CMOS converter 1106 which transforms the data latch shown in FIG. 11A into a clock gate.

FIG. 12 illustrates another embodiment of combinatorial logic in accordance with the present invention.

DETAILED DESCRIPTION OF THE DRAWINGS

In one embodiment of the present invention and referring to FIGS. 5A and 5B, data latch 500 is divided into path 501 which includes flip-flops 506, 507 and 508 and path 502 which includes flip-flops 509, 510 and 511. The Q-output terminal of flip-flop 506 is coupled to the data input terminal D of flip-flop 507. This coupling configuration is also found between flip-flops 507 and 508, flip-flops 509 and 510, and flip-flops 510 and 511. The $\overline{Q}$-output terminal of flip-flop 506 is coupled to its own data input terminal D as well as to the data input terminal of flip-flop 509 via inverter 512. The $\overline{Q}$-output terminals of flip-flops 507, 509 and 510 as well as the Q output terminals of flip-flops 508 and 511 are left floating and are not used in this embodiment.

Combinatorial logic 518 merges paths 501 and 502. Specifically, the $\overline{Q}$-output terminal of flip-flop 508 is coupled to one input terminal of NAND gate 514 while the Q output terminal of flip-flop 507 is coupled to the other input terminal of NAND gate 514. Similarly, the $\overline{Q}$-output terminal of flip-flop 511 is coupled to one input terminal of NAND gate 515 while the Q-output terminal of flip-flop 510 is coupled to the other input terminal of NAND gate 515. The output terminals of NAND gates 514 and 515 are coupled to the input terminals of NAND gate 516. The output terminal of NAND gate 516 provides the synchronized data from data latch 500 via line 517.

The input clock terminal C of flip-flops 507, 508, 510 and 511 are coupled to line 505, while the input clock terminals C of flip-flops 506 and 507 are coupled to line 503. In one embodiment of the present invention, the reset terminals of all flip-flops in data latch 500 are coupled to line 504 via inverter 513.

A low signal RG3 provided on line 504 and inverted by inverter 513, resets flip-flops 506–511 such that all Q-output signals are at a logic zero. Because the output signal Q of flip-flop 506 is a logic zero, output signal $\overline{Q}$ is a logic one. This logic one signal is provided at the input terminal D of flip-flop 507 and at the input terminal D of flip-flop 506. In turn, this logic one signal is inverted by inverter 512. Thus, a logic zero signal is provided to the data input terminal D of flip-flop 509. After signal RG3 on line 504 goes high (see waveform $504_w$), the first data bit 530 on input data line 503 (waveform $503_w$) toggles the signal on the Q-output terminal of flip-flop 506 to a logic one while the signal on the Q-output terminal of flip-flop 509 remains zero. Because the signal on the Q-output terminal of flip-flop 506 is a logic one, the signal on the $\overline{Q}$-output terminal of flip-flop 506 is a logic zero. This logic zero signal is inverted by inverter 512. Thus, a logic one signal is provided to the input data terminal D of flip-flop 509. Note that this logic one signal will be transferred to the Q-output terminal in response to the next data bit (bit 531) of signal DELDATA (see waveform 503$_w$). Note that the signals on the Q-output terminals of flip-flops 507, 508, 510 and 511 remain low, i.e. at a logic zero. Thus, at time 550, the synchronized data signal SDATA on line 517 is a logic zero. The rising edge of pulse 542 (see waveform 505$_w$ at time 551) representing the clock signal MVCOB on line 505 clocks the logic one signal on the data input terminal of flip-flop 507 to the Q-output terminal of flip-flop 507 (see waveform 507W). The signals on waveforms 506$_w$, 507$_w$ are logic ones while the signals on waveforms 508$_w$, 509$_w$, 510$_w$ and 511$_w$ at time 551 are logic zeros. The two logic one input signals to NAND gate 514, provided by the Q-output terminal of flip-flop 507 and the $\overline{Q}$-output terminal of the flip-flop 508, result in a logic zero output signal from NAND gate 514. The logic zero and one input signals to NAND gate 515, provided by the Q-output terminal of flip-flop 510 and the U-output terminal of flip-flop 511, result in a logic one output signal from NAND gate 515. Because NAND gate 516 is provided a logic zero and a logic one input signal, the output signal SDATA on line 517 from NAND gate 516 is a logic one.

The rising edge of pulse 543 of clock signal MVCOB on line 505 clocks the logic one signal on the Q-output terminal of flip-flop 507 (provided as a signal to the data input terminal D of flip-flop 508) to the Q-output terminal of flip-flop 508. The low signal at the $\overline{Q}$-output terminal of flip-flop 508, provided on one of the input terminals of NAND gate 514, changes the output signal of NAND gate 514 to a logic one, thereby also changing the output signal of NAND gate 516 to a logic zero. Note that pulse 561 on waveform 517$_w$ has a period equal to that of one clock cycle on waveform 505w.

Bit 531 of signal DELDATA on waveform 503$_w$ toggles the signals on the Q-output terminals of flip-flops 506 and 509 to a logic zero and one, respectively. The rising edge of pulse 544 of clock signal MVCOB clocks the signals on the Q-output terminals of flip-flops 507 and 510 to a logic zero and logic one, respectively. Thus, the synchronized output data signal SDATA at time 554 is a logic one.

Bit 532 of data signal DELDATA (waveform 503$_w$) toggles the signals on the Q-output terminals of flip-flops 506 and 509 to a logic one and zero, respectively. The rising edge of pulse 545 of clock signal MVCOB clocks the signals on the output terminals of flip-flops 507, 508, 510, and 511 to a logic one, zero, zero, and one, respectively. Thus, at time 556, the synchronized data output signal SDATA remains at a logic one.

Pulse 546 of clock signal MVCOB clocks the signal on the Q-output terminal of flip-flop 508 to a logic one and clocks the signal on the $\overline{Q}$-output terminal of flip-flop 511 to a logic zero. Thus, at time 557, the synchronized data output signal SDATA is set to a logic zero. Note that although data bits 531 and 532 are separated by less than one clock period (waveform 505$_w$), the present invention detects both pulses and provides a contiguous logic one signal for two MVCOB clock cycles (see pulse 562 on waveform 517$_w$).

Therefore, as shown above in reference to FIGS. 5A and 5B, flip-flop 506 in path 501 is triggered by odd bits (i.e. bits 530 and 532) to provide a logic one signal on its Q-output terminal, and is triggered by even bits (i.e. bit 531) to provide a logic zero signal on its Q-output terminal.

In contrast, flip-flop 509 in path 502 is triggered by even bits (i.e. bit 531) to provide a logic one signal on its Q-output terminal, and is triggered by odd data bits (i.e. bit 532) to provide a logic zero signal on its Q-output terminal. Flip-flops 507, 508, 510 and 511 are triggered by the rising edges of the clock pulses on line 505.

In accordance with the present invention, data window boundaries are alternately defined by the following periods:

1. the propagation delay of a logic one signal from the clock input terminal of flip-flop 506 to its Q-output terminal, plus the set-up time of a logic one at the data input terminal D of flip-flop 507; or 2. the propagation delay of a logic one signal from the clock input terminal of flip-flop 509 to its Q-output terminal, plus the set-up time of a logic one at the data input terminal D of flip-flop 510.

To ensure that even and odd windows are equal in size, the propagation delays for periods 1 and 2 must be substantially equal. To achieve this equality, the present invention provides identical logic elements in flip-flops 506 and 509, and identical data-to-clock set-up times in flip-flops 507 and 510. In this manner, the present invention equalizes the window boundary decision points through paths 501 and 502, thereby preventing odd-even window distortion.

Moreover, because flip-flops 506–511 in data latch 500 are not reset after the start of the data read operation, the present invention eliminates the blind spots produced by the prior art latches. Thus, the present invention allows for a fully open window, i.e. every data bit regardless of location within a window is properly detected. Furthermore, in accordance with the present invention, all flip-flops operate at half the frequency of the conventional prior art latches shown in FIGS. 2 and 3.

As mentioned previously in reference to FIG. 1A, the VCO output signal on line 103 is provided to phase comparator 108 to close the phase locked loop. Typically, phase comparator 108 has full frequency discrimination capability, i.e. phase comparator 108 forces the VCO toward the input (i.e. data) frequency regardless of the magnitude of the frequency difference. Because the channel data is pseudo-random and often has no component at the actual clock frequency, unqualified (directly connected) feedback by VCO 110 would result an unpredictable, and thus unusable, VCO frequency.

To avoid this condition, the feedback signal from VCO 110 on line 103 is first qualified by the arrival of an input data pulse on a one-for-one basis prior to being provided to the negative input terminal of phase comparator 108. This qualifier circuit is referenced as clock gate 111. Clock gate 111, like data latch 101, establishes a window about the average input data pulse leading edge. If a data pulse on line 105 arrives at the input terminal to clock gate 111, no output transition occurs at the output terminal of clock gate 111, but clock gate 111 is enabled to pass the next recovered clock pulse on line 103. The next occurring clock edge on line 103 is transmitted to phase comparator 108 and the gate closes. The latch will remain "closed" to further clock pulses on line 103 until after the arrival of another data pulse on line 105. In one embodiment of the present invention, an anticipator delay of one-half the VCO period sets and centers this gating window in the below-described method.

Phase-locked loop 100, if in stable lock, forces the pulses at the (positive and negative) input terminals of phase comparator 108 to occur substantially simultaneously (i.e. analogous to an operational amplifier forcing signals on the positive and negative input terminals to substantially equal voltages when operating in a closed-loop configuration). With the half-cell anticipator delay configured as shown in FIG. 1A, the incoming data pulses on line 105 will lead phase comparator input pulses by the delay magnitude, which is chosen to be ½ the period of VCO 110. If clock gate 111 is assumed to have no delay, the output pulses from VCO 110 are synchronized with the input pulses of phase comparator 108, and thus lag the input data pulses by ½ the period of VCO 110. In this manner, the average input data pulse edge occurs exactly halfway between the rising edges of pulses from VCO 110. Thus, in accordance with the present invention, data pulses have a freedom of movement (jitter tolerance) of plus or minus one-half of the VCO period while still opening clock gate 111 for the appropriate (next) VCO pulse. Assuming the input data pulse jitter characteristics are symmetrical about a mean position, this centering of the data pulses within the window defined by VCO 110 produces the lowest possible bit error rate (BER).

Typical clock gate requirements include:
1. a very small metastability region at the window boundaries for minimum decision loss,
2. a rapid recovery from transmission of each bit for maximum transfer rate capability (high pulse repetition rate), and
3. an RZ (return-to-zero) output pulse. Note that data latch 101 is distinguished from clock gate 111 by having a non-return-to-zero output pulse.

FIG. 6A illustrates a prior art clock gate 600 having the identical configuration of data latch 200 (FIG. 2A). The output signal on line 605, instead of being synchronized data, is a gated clock signal GC1. However, as shown in the waveform $605_w$ of FIG. 6B, clock gate 600 suffers from the same drawbacks as data latch 200. Specifically, clock gate 600 fails to detect input data pulses at or above clock frequency, such as bits 613 and 615.

FIG. 7A illustrates another known clock gate 700 having a similar configuration to data latch 300 (FIG. 3). Clock gate 700 eliminates flip-flop 303 which reshaped the output pulse signal of data latch 300 to substantially the width of one clock cycle. In clock gate 700, the width of the gated clock signal GC2 is set by the self-clearing time of flip-flop 702. However, this configuration undesirably extends the blind spot width, i.e., the time flip-flop 701 is held cleared and is unable to accept input data transitions.

Another prior art clock gate 800, shown in FIG. 8, has a similar configuration to data latch 400 shown in FIG. 4. Specifically, clock gate 800 includes three flip-flops 801, 802 and 803 and a NOR gate 804. Clock gate 800 further includes an inverter gate 850 coupled to line 807, which provides the clock signal, and the clock input terminal CK of flip-flop 803. Referring to Figure 8B, the gated clock signal GC3, as shown by waveform $805_w$, exhibits a return-to-zero (RZ) feature which is particularly advantageous for clocking edge-activated circuitry downstream, even at full clock frequency (i.e. gating action repeated at every clock cycle). Thus, as shown in FIG. 8B, all input data bits 811, 812, 813, 814, and 815 are detected by clock gate 800 as demonstrated by output pulses 816, 817, 818, 819 and 820, respectively. However, clock gate 800 suffers from the same disadvantage of data latch 400 (FIG. 4). Specifically, clock gate 800 is preferably implemented in differential emitter-coupled logic (ECL) because propagation delays are independent of the direction of edge transition (e.g., the signal propagation delay from a flip-flop clock input terminal to a positive transition at its Q-output terminal is equal to the signal propagation delay between the clock input terminal and the negative transition at the Q output terminal). The data window boundaries of clock gate 800 are alternately defined by the following periods:

1. the propagation delay of a logic one signal on line 806 from the clock input terminal CK on flip-flop 801 to a logic one at its Q-output terminal, plus the set-up time of a logic one at the D-input terminal of flip-flop 802, or 2. the propagation delay of a logic zero signal on line 806 from the clock input terminal CK on flip-flop 801 to a logic zero at its Q-output terminal, plus the set-up time of a logic zero at the D-input terminal of flip-flop 802.

In differential ECL logic, periods 1 and 2 are substantially equal. ECL has the disadvantages of being physically larger and consuming significantly more power than CMOS logic. However, if clock gate 800 is implemented in single-ended CMOS technology, achieving substantially equal time delays for periods 1 and 2 is difficult, and frequently results in a skew in size between odd-bit windows and even-bit windows.

FIG. 9A illustrates a clock gate 900 having a similar configuration to data latch 800. Clock gate 900 includes flip-flops 901 and 902. Input data is provided on line 906 to the clock terminal CK of flip-flop 901. The $\overline{Q}$-output terminal of flip-flop 901 is coupled to its own data input terminal D. The Q-output terminal is further coupled to the data input terminal D of flip-flop 902, as well as to one input terminal of NOR gate 904. The clock signal is provided on line 907 to the clock at terminal CK on flip flop 902. The $\overline{Q}$ output terminal of flip-flop 902 is coupled to the other input terminal of NOR gate 904. NOR gate 904 provides the resulting gated clock signal GC4 on line 905. As shown in FIG. 9B, waveform 910, which represents gated clock signal GC4, has a varying duty cycle (as a function of input pulse position), but the position of rising edges 930 which carry the timing information are preserved in relation to the rising edges 830 shown on waveform 810 in FIG. 8B. However, clock gate 900 has the same disadvantage described above in reference to FIGS. 8A and 9A (and therefore is not described in detail herein).

FIG. 10A illustrates a clock gate 1000 in accordance with the present invention having an identical configuration to data latch 500 shown in FIG. 5, with the exception that inverter 1070 on line 1005 inverts the clock signal to flip flops 1008 and 1011. This inversion of the clock signal, as shown by waveform $1017_w$ in FIG. 10B, creates an output pulse, for example pulses 1061, 1062 and 1063, which are ½ of one clock period in width, instead of the full clock period exhibited by pulse 561 in FIG. 5B. This shortened pulse period allows clock gate 1000 to be used as a gated clock source for downstream circuitry.

The gating circuits, i.e. the data latch and the clock gate, in accordance with the present invention further provide a substantially fully-open pulse capture window.

Another embodiment of a data latch 1100 in accordance with the present invention is illustrated in FIG. 11A. Data latch 1100 includes differential ECL flip-flops 1101 and 1102, differential ECL-to-CMOS converters 1103 and 1106, standard CMOS flip-flop 1104 and NOR gate 1105. As is well-known in the art, signals in differential ECL are represented by two lines. The state of a logic signal on one line is the complement of the signal on the other line. For example, referring to FIG. 11A, if the signal on input data line 1107A transitions from high to low, then the signal on input data line 1107B transitions from low to high. A logic decision is made at the point where the two voltages cross as the two voltages transition to the other state. In other words, the point at which the two voltages cross is the equivalent threshold point for differential ECL logic. ECL-to-CMOS converter 1103 and 1106 are positioned between differential, ECL flip-flops 1101 and 1102 and CMOS flip-flop 1104 to ensure proper signal form.

Data latch 1100 functions similarly to data latch 400 (FIG. 4A). Specifically, data latch 1100 splits odd and even data pulses. For example, data latch 1100 transforms odd bits into rising edges and transforms even bits into falling edges. However, data latch 1100 interprets rising and falling edges identically because of its fully symmetrical balanced propagation delay logic. Thus, the windows provided by data latch 1100 are ensured to be the same size, thereby optimizing performance of the data latch.

Data latch 1100 has certain advantages over data latch 400. Specifically, the propagation delay from the clock input terminal to its Q-output terminal when the Q-output signal is transitioning to a logic one is identical to the propagation delay from the clock input terminal to its Q-output terminal when the Q-output signal is transitioning to a logical zero. Thus, the threshold point occurs at the same point in time irrespective of logic state. In this embodiment, differential ECL flip-flops 1101 and 1102 perform the splitting of the even and odd data pulses, thereby permitting this operation to occur at half the frequency of prior art data latches which allows interpretation of the rising and falling edges to be significantly improved. After this splitting operation, done by the relatively large, high-power differential ECL circuitry, the signals are provided to the relatively small, low-power CMOS circuitry. Thus, data latch 1100 significantly improves performance by having all timing decisions made by differential ECL logic which is faster than CMOS logic.

Note that reversing the input signals (i.e. inverting the signal on input line 1108A, not on input line 1108B) to ECL-to-CMOS converter 1106 as shown in FIG. 11B transforms data latch 1100 into a clock gate which is functionally similar to clock gate 800 illustrated in FIG. 8.

The above description is meant to be illustrative and not limiting. Those skilled in the art will be able to devise other configurations within the scope of the present invention upon consideration of the detailed description and the accompanying drawings. For example, as shown in FIG. 12, combinatorial logic 1200 in another embodiment of the present invention includes AND gates 1201/1202 substituted for NAND gates 514/515 (FIG. 5) or NAND gates 1014/1015 (FIG. 10) and OR gate 1203 substituted for NAND gate 516 or NAND gate 1016. In other embodiments of the present invention, the inverting terminal of a flip-flop is coupled to the data input terminal of another flip-flop instead of the non-inverting terminal (shown in FIGS. 5A and 10A). In these embodiments, other appropriate combinatorial logic is used to provide the correct output signal. Additionally, although the above-described gating circuits are shown in CMOS technology, other embodiments of the present invention employ other technologies, such as I²L and TTL. The present invention is set forth in the appended claims.

I claim:

1. A data latch for providing synchronous data comprising:

a first plurality of flip-flops triggered by even data pulses to provide a first logic state signal, said first plurality of flip-flops triggered by odd data pulses to provide a second logic state signal;

a second plurality of flip-flops triggered by said even data pulses to provide said second logic state signal, said second plurality of flip-flops triggered by said odd data pulses to provide said first logic state signal; and combinational logic to couple said first plurality of flip-flops and said second plurality of flip-flops to provide said synchronous data, wherein each flip-flop includes a data input terminal, a clock input terminal, and a first output terminal, wherein said even and odd data pulses are provided to the clock input terminal of a first flip-flop in said first plurality of flip-flops and the clock input terminal of a second flip-flop in said second plurality of flip-flops.

2. The data latch of claim 1 wherein said first flip-flop includes a second output terminal, wherein the second output terminal of said first flip-flop is coupled to the data input terminal Of said first flip-flop and the data input terminal of said second flip-flop.

3. The data latch of claim 2 further including means for inverting the signal provided on said second output terminal of said first flip-flop to said data input terminal of said second flip-flop.

4. A data latch for providing synchronous data comprising:

a first path triggered by even data pulses to provide a first logic state signal, said first path triggered by odd data pulses to provide a second logic state signal;

a second path triggered by said even data pulses to provide said second logic state signal, said second path triggered by said odd data pulses to provide said first logic state signal; and combinational logic to couple said first path and said second path to provide said synchronous data, wherein said first path comprises a first, second, and third flip-flop, each flip-flop having a data input terminal, a clock input terminal, and a first output terminal, wherein said first flip-flop includes a second output terminal, further wherein said first output terminal of said first flip-flop is coupled to said data input terminal of said second flip-flop, said second output terminal of said first flip-flop is coupled to said data input terminal of said first flip-flop, and said first output terminal of said second flip-flop is coupled to said data input terminal of said third flip-flop.

5. The data latch of claim 4 wherein said second path comprises a second plurality of coupled flip-flops.

6. The data latch of claim 5 wherein said second plurality of flip-flops includes a fourth, fifth, and sixth flip-flop, each flip-flop having a data input terminal, a clock input terminal, and a first output terminal.

7. The data latch of claim 6 wherein said first output terminal of said fourth flip-flop is coupled to said data input terminal of said fifth flip-flop, and said first output terminal of said fifth flip-flop is coupled to said data input terminal of said sixth flip-flop.

8. The data latch of claim 7 further including a data input line and a clock input signal line.

9. The data latch of claim 8 wherein said clock input terminals of said first and said fourth flip-flops are coupled to said data input line.

10. The data latch of claim 9 wherein said clock input terminals of said second, third, fifth, and sixth flip-flops are coupled to said clock input signal line.

11. The data latch of claim 10 further including a reset signal line wherein each of said flip-flops further includes a reset terminal coupled to said reset signal line.

12. The data latch of claim 10 wherein said data input terminal of said first flip-flop is coupled to said input terminal of said fourth flip-flop via an inverter.

13. The data latch of claim 12 wherein said combinatorial logic includes a first, second, and third NAND gate, each NAND gate having a first input terminal, a second input terminal, and an output terminal.

14. The data latch of claim 13 wherein said first output terminal of said third flip-flop is coupled to said second input terminal of said first NAND gate.

15. The data latch of claim 14 wherein said first output terminal of said second flip-flop is coupled to said first input terminal of said first NAND gate.

16. The data latch of claim 15 wherein said first output terminal of said sixth flip-flop is coupled to said second input terminal of said second NAND gate.

17. The data latch of claim 16 wherein said first output terminal of said fifth flip-flop is coupled to said first input terminal of said second NAND gate.

18. The data latch of claim 17 wherein said output terminal of said first NAND gate is coupled to said first input terminal of said third NAND gate, and wherein said output terminal of said second NAND gate is coupled to said second input terminal of said third NAND gate.

19. The data latch of claim 18 wherein said output line of said third NAND gate provides said synchronous data signal.

20. The data latch of claim 12 wherein said combinatorial logic includes a first and a second AND gate, and an OR gate, wherein each AND gate and said OR gate has a first input terminal, a second input terminal, and an output terminal.

21. The data latch of claim 20 wherein said first output terminal of said third flip-flop is coupled to said second input terminal of said first AND gate.

22. The data latch of claim 21 wherein said first output terminal of said second flip-flop is coupled to said first input terminal of said first AND gate.

23. The data latch of claim 22 wherein said first output terminal of said sixth flip-flop is coupled to said second input terminal of said second AND gate.

24. The data latch of claim 23 wherein said first output terminal of said fifth flip-flop is coupled to said first input terminal of said second AND gate.

25. The data latch of claim 24 wherein said output terminal of said first AND gate is coupled to said first input terminal of said OR gate, and wherein said output terminal of said second AND gate is coupled to said second input terminal of said OR gate.

26. The data latch of claim 18 wherein said output line of said OR gate provides said synchronous data signal.

27. A clock gate for providing a gated clock signal comprising:
a first plurality of flip-flops triggered by even data pulses to provide a first logic state signal, said first plurality of flip-flops triggered by odd data pulses to provide a second logic state signal;
a second plurality of flip-flops triggered by said even data pulses to provide said second logic state signal, said second plurality of flip-flops triggered by said odd data pulses to provide said first logic state signal; and
combinational logic to couple said first plurality of flip-flops and said second plurality of flip-flops to provide said gated clock signal, wherein each flip-flop includes a data input terminal, a clock input terminal, and a first output terminal, wherein said even and odd data pulses are provided to the clock input terminal of a first flip-flop in said first plurality of flip-flops and the clock input terminal of a second flip-flop in said second plurality of flip-flops.

28. The clock gate of claim 27 wherein said first flip-flop includes a second output terminal, wherein the second output terminal of said first flip-flop is coupled to the data input terminal of said first flip-flop and the data input terminal of said second flip-flop.

29. The clock gate of claim 28 further including means for inverting the signal provided on said second output terminal of said first flip-flop to said input data terminal of said second flip-flop.

30. A clock gate for providing a gated clock signal comprising:
a first path triggered by even data pulses to provide a first logic state signal, said first path triggered by odd data pulses to provide a second logic state signal;
a second path triggered by said even data pulses to provide said second logic state signal, said second path triggered by said odd data pulses to provide said first logic state signal; and
combinational logic to couple said first path and said second path to provide said gated clock signal, wherein said first path comprises a first, second, and third flip-flop, each flip-flop having a data input terminal, a clock input terminal, and a first output terminal,
wherein said first flip-flop includes a second output terminal, further wherein said first output terminal of said first flip-flop is coupled to said data input terminal of said second flip-flop, said second output terminal of said first flip-flop is coupled to said data input terminal of said first flip-flop, and said first output terminal of said second flip-flop is coupled to said data input terminal of said third flip-flop.

31. The clock gate of claim 30 wherein said second path comprises a second plurality of coupled flip-flops.

32. The clock gate of claim 31 wherein said second plurality of flip-flops includes a fourth, fifth, and sixth flip-flop, each flip-flop having a data input terminal, a clock input terminal, and a first output terminal.

33. The clock gate of claim 32 wherein said first output terminal of said fourth flip-flop is coupled to said data input terminal of said fifth flip-flop, and said first output terminal of said fifth flip-flop is coupled to said data input terminal of said sixth flip-flop.

34. The clock gate of claim 33 further including a data input line and a clock input signal line.

35. The clock gate of claim 34 wherein said clock input terminals of said first and said fourth flip-flops are coupled to said data input line.

36. The clock gate of claim 35 further including a first inverter, wherein said clock input terminals of said second and fifth flip-flops are coupled to said clock input signal line, and said clock input terminals of said third and sixth flip-flops are coupled to said clock input signal line via said first inverter.

37. The clock gate of claim 36 further including a reset signal line wherein lack of said flip-flops further includes a reset terminal coupled to said reset signal line.

38. The clock gate of claim 36 further including a second inverter, wherein said first output terminal of said first flip-flop is coupled to said input terminal of said fourth flip-flop via said second inverter.

39. The clock gate of claim 36 wherein said combinatorial logic includes a first, second, and third NAND gate, each NAND gate having a first input terminal, a second input terminal, and an output terminal.

40. The clock gate of claim 39 wherein said first output terminal of said third flip-flop is coupled to said second input terminal of said first NAND gate.

41. The clock gate of claim 40 wherein said first output terminal of said second flip-flop is coupled to said first input terminal of said first NAND gate.

42. The clock gate of claim 41 wherein said first output terminal of said sixth flip-flop is coupled to said second input terminal of said second NAND gate.

43. The clock gate of claim 42 wherein said first output terminal of said fifth flip-flop is coupled to said first input terminal of said second NAND gate.

44. The clock gate of claim 43 wherein said output terminal of said first NAND gate is coupled to said first input terminal of said third NAND gate, and wherein said output terminal of said second NAND gate is coupled to said second input terminal of said third NAND gate.

45. The clock gate of claim 44 wherein said output line of said third NAND gate provides said gated clock signal.

46. The clock gate of claim 36 wherein said combinatorial logic includes a first and a second AND gate, and an OR gate, each AND gate and said OR gate having a first input terminal, a second input terminal, and an output terminal.

47. The clock gate of claim 46 wherein said first output terminal of said third flip-flop is coupled to said second input terminal of said first AND gate.

48. The clock gate of claim 47 wherein said first output terminal of said second flip-flop is coupled to said first input terminal of said first AND gate.

49. The clock gate of claim 48 wherein said first output terminal of said sixth flip-flop is coupled to said second input terminal of said second AND gate.

50. The clock gate of claim 49 wherein said first output terminal of said fifth flip-flop is coupled to said first input terminal of said second AND gate.

51. The clock gate of claim 50 wherein said output terminal of said first AND gate is coupled to said first input terminal of said OR gate, and wherein said output terminal of said second AND gate is coupled to said second input terminal of said OR gate.

52. The clock gate of claim 44 wherein said output line of said OR gate provides said gated clock signal.

53. A data latch for providing synchronous data comprising:

means for splitting odd and even data pulses; and means for receiving said odd and even data pulses and outputting said synchronous data, wherein said means for splitting is implemented in differential ECL technology to provide a fully symmetrical propagation delay of said odd and even data pulses, and said means for receiving is implemented in CMOS technology.

54. The data latch of claim 53 further comprising means for converting signals from said differential ECL technology to signals in said CMOS technology.

55. A data latch for providing synchronous data comprising:

means for splitting odd and even data pulses;

means for receiving said odd and even data pulses and outputting said synchronous data, wherein said means for splitting is implemented in differential ECL technology and said means for receiving is implemented in CMOS technology; and means for converting signals from said differential ECL technology to signals in said CMOS technology, wherein said means for splitting includes a first and a second differential ECL flip-flop, each flip-flop having an input terminal, an output terminal, and a clock terminal, wherein the propagation of said odd data pulse from said input terminal to said output terminal is identical to the propagation of said even data pulse from said input terminal to said output terminal.

56. The data latch of claim 55 wherein said means for receiving includes a CMOS flip-flop having an input terminal, an output terminal, and a clock terminal.

57. The data latch of claim 56 wherein said means for converting includes a first and a second ECL-to-CMOS converter.

58. A data latch for providing synchronous data comprising:

means for splitting odd and even data pulses, wherein said means for splitting includes a first and a second differential ECL flip-flop, each flip-flop having an input terminal, and output terminal and a clock terminal;

means for receiving said odd and even data pulses and outputting said synchronous data, wherein said means for splitting is implemented in differential ECL technology and said means for receiving is implemented in CMOS technology, wherein said means for receiving includes a CMOS flip-flop having an input terminal, an output terminal, and a clock terminal; and means for converting signals from said differential ECL technology to signals in said CMOS technology, wherein said means for converting includes a first and a second ECL-to-CMOS converter, wherein said data terminal of said first differential ECL flip-flop is coupled to said output terminal of said first differential ECL flip-flop and said data terminal of said second differential ECL flip-flop.

59. The data latch of claim 58 further including means for providing a clock input signal coupled to said clock terminal of said second differential, ECL flip-flop and said second ECL-to-CMOS converter.

60. The data latch of claim 59 wherein said first differential ECL-to-CMOS converter is coupled to said output terminal of said second differential, ECL flip-flop.

61. The data latch of claim 60 wherein said first and second differential ECL-to-CMOS converters are coupled to said data terminal of said CMOS flip-flop and said clock terminal of said CMOS flip-flop, respectively.

62. The data latch of claim 61 wherein said means for receiving further includes a CMOS exclusive-OR gate, coupled to said first differential, ECL-to-CMOS converter and said output terminal of said CMOS flip-flop.

63. The data latch of claim 62 wherein said CMOS exclusive-OR gate provides said synchronous data.

64. A clock gate for providing a gated clock signal comprising:

means for splitting odd and even data pulses; and means for receiving said odd and even data pulses and outputting said clock signal, wherein said means for splitting is implemented in differential ECL technology to provide a fully symmetrical propagation delay of said odd and even data pulses, and said means for receiving is implemented in CMOS technology.

65. The clock gate of claim 64 further comprising means for converting signals from said differential ECL technology to signals in said CMOS technology.

66. A clock gate for providing a gated clock signal comprising:

means for splitting odd and even data pulses;

means for receiving said odd and even data pulses and outputting said clock signal, wherein said means for splitting is implemented in differential ECL technology and said means for receiving is implemented in CMOS technology; and means for converting signals from said differential ECL technology to signals in said CMOS technology, wherein said means for splitting includes a first and a second differential ECL flip-flop, each flip-flop having an input terminal, an output terminal, and a clock terminal, wherein the propagation of said odd data pulse from said input terminal to said output terminal is identical to the propagation of said even data pulse from said input terminal to said output terminal.

67. The clock gate of claim 66 wherein said means for receiving includes a CMOS flip-flop having an input terminal, an output terminal, and a clock terminal.

68. The clock gate of claim 67 wherein said means for converting includes a first and a second ECL-to-CMOS converter.

69. A clock gate for providing a gated clock signal comprising:

means for splitting odd and even data pulses, wherein said means for splitting includes a first and a second differential ECL flip-flop, each flip-flop having an input terminal, an output terminal and a clock terminal;

means for receiving said odd and even data pulses and outputting said clock signal, wherein said means for splitting is implemented in differential ECL technology and said means for receiving is implemented in CMOS technology, wherein said means for receiving includes a CMOS flip-flop having an input terminal, an output terminal, and a clock terminal; and means for converting signals from said differential ECL technology to signals in said CMOS technology, wherein said means for converting includes a first and a second ECL-to-CMOS converter, wherein said data terminal of said first differential ECL flip-flop is coupled to said output terminal of said first differential ECL flip-flop and said data terminal of said second differential ECL flip-flop.

70. The clock gate of claim 69 further including means for providing a clock input signal coupled to said clock terminal of said second differential, ECL flip-flop and said second ECL-to-CMOS converter.

71. The clock gate of claim 70 wherein said first differential ECL-to-CMOS converter is coupled to said output terminal of said second differential, ECL flip-flop.

72. The clock gate of claim 71 wherein said first and second differential ECL-to-CMOS converters are coupled to said data terminal of said CMOS flip-flop and said clock terminal of said CMOS flip-flop, respectively.

73. The clock gate of claim 72 wherein said means for receiving further includes a CMOS exclusive-OR gate, coupled to said first differential, ECL-to-CMOS converter and said output terminal of said CMOS flip-flop.

74. The clock gate of claim 73 wherein said CMOS exclusive-OR gate provides said gated clock signal.

75. A method for providing synchronous data comprising the steps of:

splitting an odd and an even data pulse;

transforming said odd data pulse into either a rising or a falling edge of a signal;

transforming said even data pulse into the edge of a signal not formed by said odd data pulse;

providing said signals to combinatorial logic;

outputting said synchronous data from said combinatorial logic, wherein said step of splitting and transforming is performed with differential, ECL circuitry to ensure identical interpretation of said rising and falling edges, and said step of providing is performed with CMOS circuitry.

76. A method of providing synchronous data comprising the steps of:

triggering a first path by even data pulses to provide a first logic state signal, said first path triggered by odd data pulses to provide a second logic state, wherein said first path includes a first flip-flop having a clock terminal for receiving said even and odd data pulses;

triggering a second path by said even data pulses to provide said second logic state signal, said second path triggered by said odd data pulses to provide said first logic state signal, wherein said second path includes a second flip-flop having a clock terminal for receiving said even and odd data pulses; and coupling said first path and said second path to combinatorial logic, said combinatorial logic providing said synchronous data.

77. A method for providing a gated clock signal comprising the steps of:

splitting odd and even data pulse;

transforming said odd data pulses into either a rising or a falling edge of a signal;

transforming said even data pulses into the edge of a signal not formed by said odd data pulses;

providing said signals to combinatorial logic;

outputting said clock signal from said combinatorial logic, wherein said step of splitting and transforming is performed with differential, ECL circuitry to ensure identical interpretation of said rising and falling edges, and said step of providing is performed with CMOS circuitry.

78. A method of providing a gated clock signal comprising the steps of:

triggering a first path by even data pulses to provide a first logic state signal, said first path triggered by odd data pulses to provide a second logic state, wherein said first path includes a first flip-flop having a clock terminal for receiving said even and odd data pulses;

triggering a second path by said even data pulses to provide said second logic state signal, said second path triggered by said odd data pulses to provide said first logic state signal, wherein said second path includes a second flip-flop having a clock terminal for receiving said even and odd data pulses; and coupling said first path and said second path to combinatorial logic, said combinatorial logic providing said clock signal.

* * * * *